(12) United States Patent
Ooshima

(10) Patent No.: US 10,753,999 B2
(45) Date of Patent: Aug. 25, 2020

(54) MAGNETIC RESONANCE IMAGING APPARATUS

(71) Applicant: TOSHIBA MEDICAL SYSTEMS CORPORATION, Otawara-shi, Tochigi-ken (JP)

(72) Inventor: Kiyomi Ooshima, Nasushiobara Tochigi (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1200 days.

(21) Appl. No.: 14/556,795

(22) Filed: Dec. 1, 2014

(65) Prior Publication Data

US 2015/0153434 A1 Jun. 4, 2015

(30) Foreign Application Priority Data

Dec. 2, 2013 (JP) .................................. 2013-249503

(51) Int. Cl.
*G01R 33/567* (2006.01)
*G01R 33/56* (2006.01)
*G01R 33/483* (2006.01)
*G01R 33/565* (2006.01)

(52) U.S. Cl.
CPC ........ *G01R 33/5676* (2013.01); *G01R 33/483* (2013.01); *G01R 33/4835* (2013.01); *G01R 33/5608* (2013.01); *G01R 33/56509* (2013.01)

(58) Field of Classification Search
CPC .............. G01R 33/483; G01R 33/4835; G01R 33/5608; G01R 33/56509; G01R 33/5676; G01R 33/567
See application file for complete search history.

(56) References Cited

U.S. PATENT DOCUMENTS

| 2011/0178388 A1 | 7/2011 | Kuhara et al. |
| 2011/0178392 A1* | 7/2011 | Kuhara ............... G01R 33/5635 600/413 |
| 2012/0093384 A1* | 4/2012 | Goto .................... G01R 33/543 382/131 |
| 2014/0159724 A1* | 6/2014 | Praveen ................. G01R 33/54 324/309 |

FOREIGN PATENT DOCUMENTS

| JP | 2008-154887 | 7/2008 |
| JP | 2011-147561 | 8/2011 |

* cited by examiner

*Primary Examiner* — Rishi R Patel
(74) *Attorney, Agent, or Firm* — Nixon & Vanderhye P.C.

(57) ABSTRACT

A magnetic resonance imaging apparatus according to an embodiment includes a processor and a memory. The memory stores processor-executable instructions that cause the processor to perform an application region scan for acquiring data on an area covering a diaphragm in order to position an application region of a motion detection pulse and a multi-slice scan for acquiring first multi-slice data on an area covering a heart; and acquire a slice image of the heart that is positioned using the first multi-slice data, with application of the motion detection pulse. In acquiring the slice image, when breathing motion of a subject is continuously out of an allowable range for a given period, the processor corrects a position of the application region by calculation using the second multi-slice data acquired by performing the multi-slice scan again and a positional relationship obtained by the application region scan and the multi-slice scan.

7 Claims, 14 Drawing Sheets

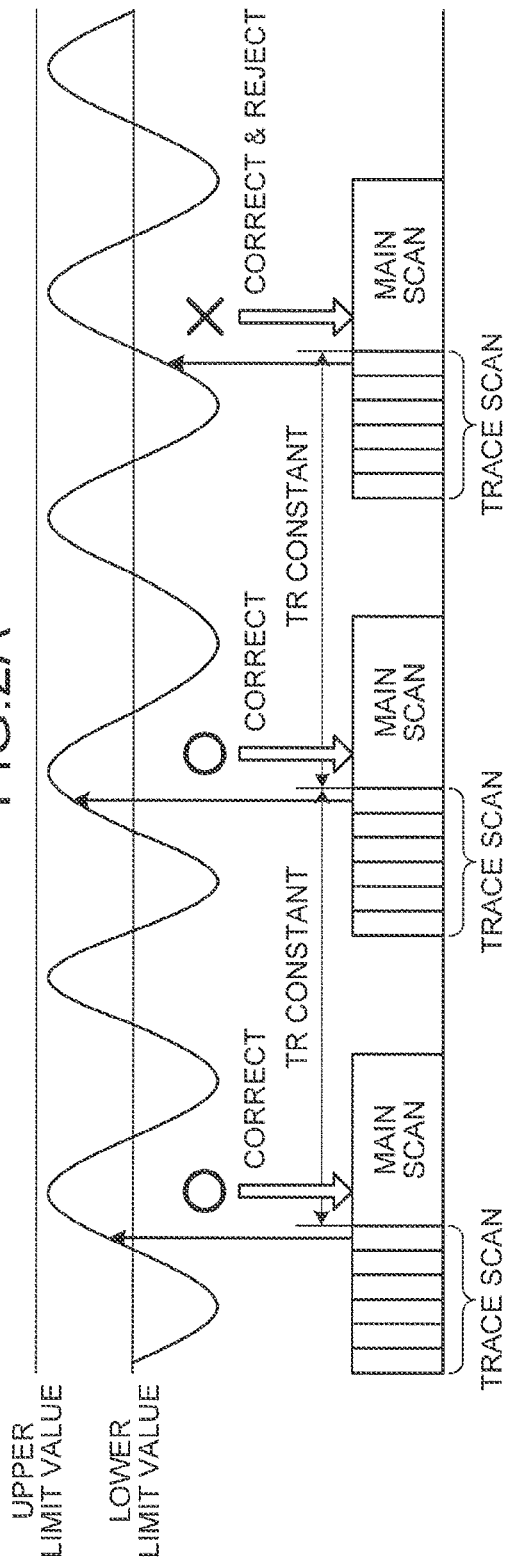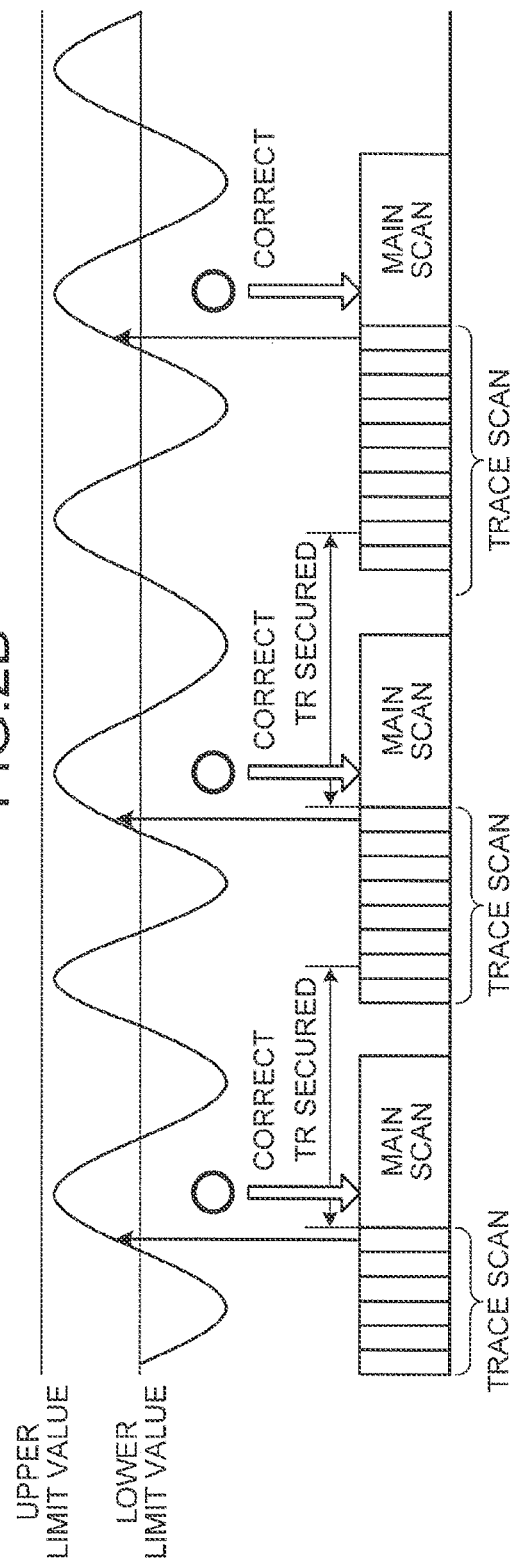

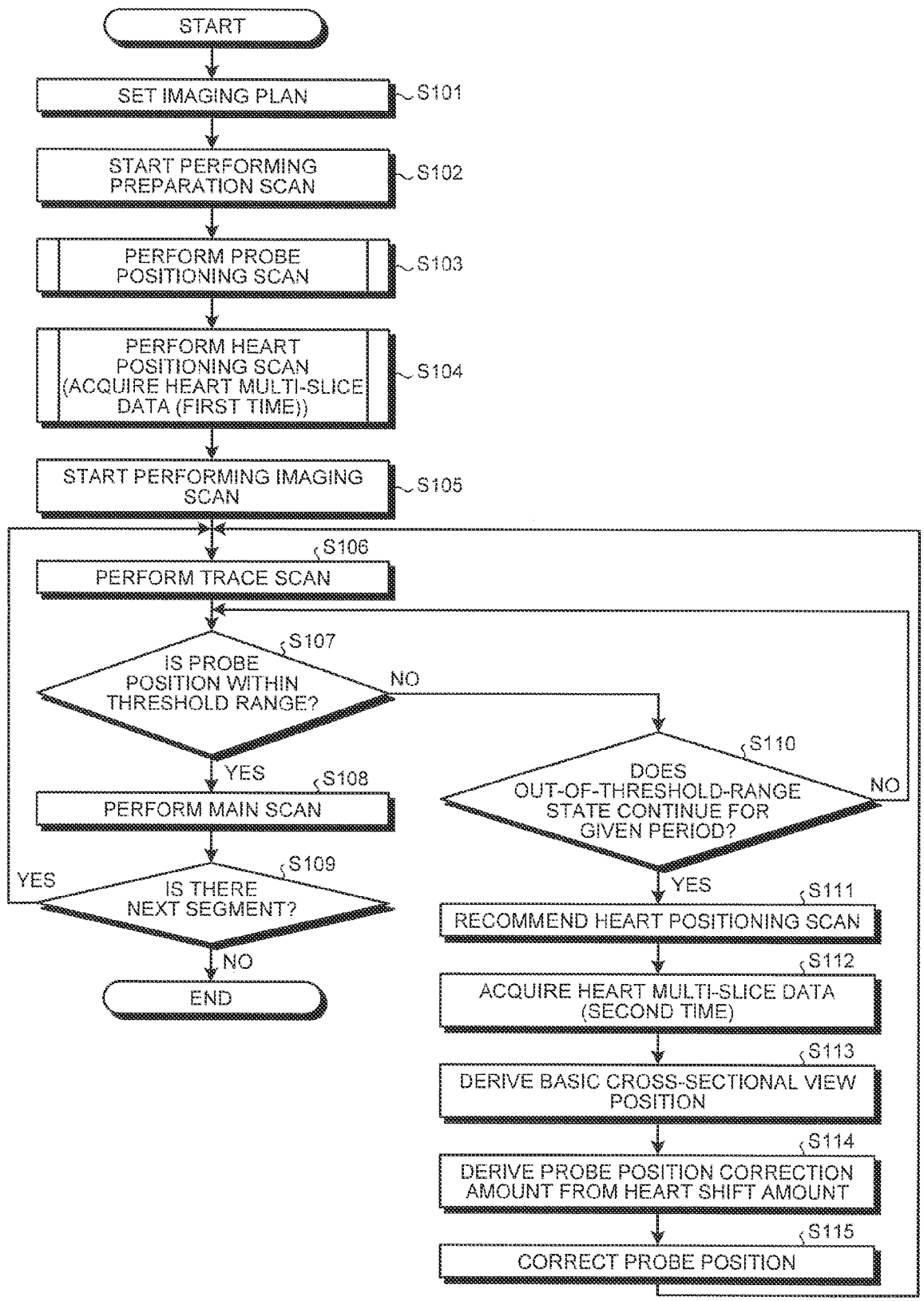

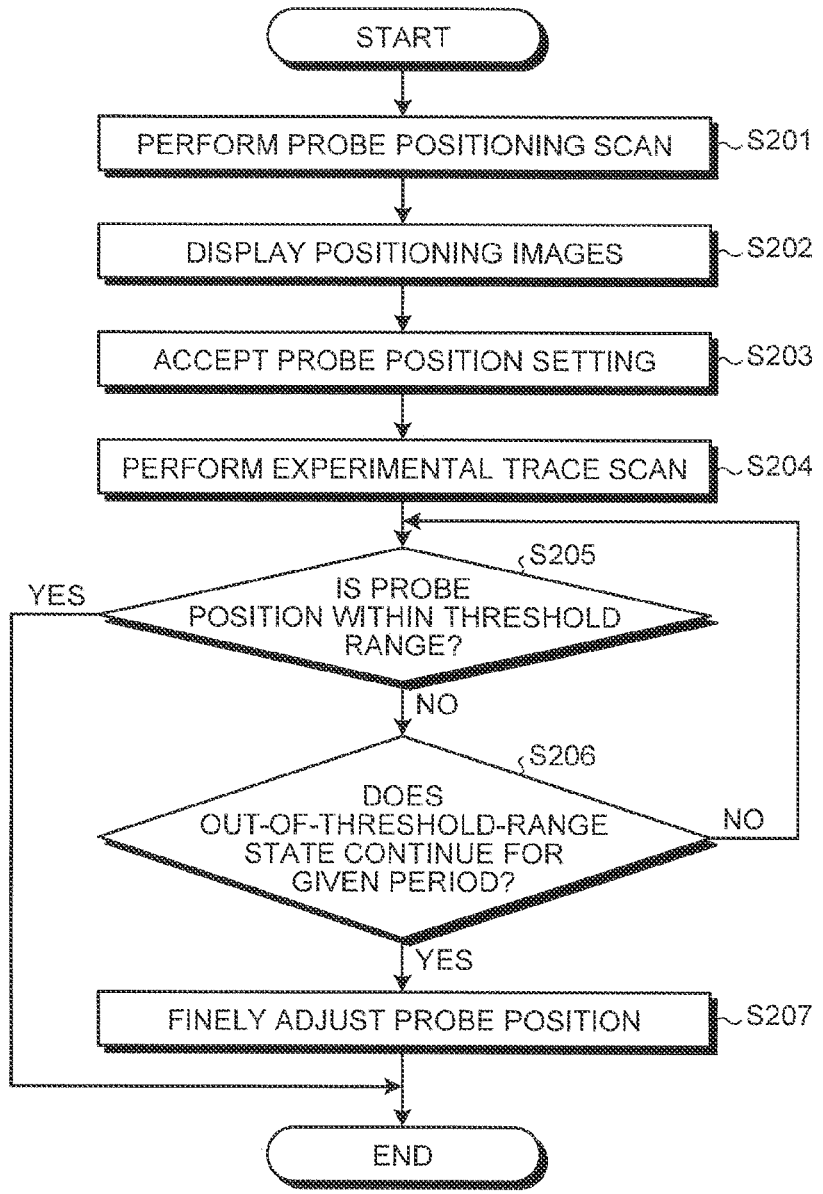

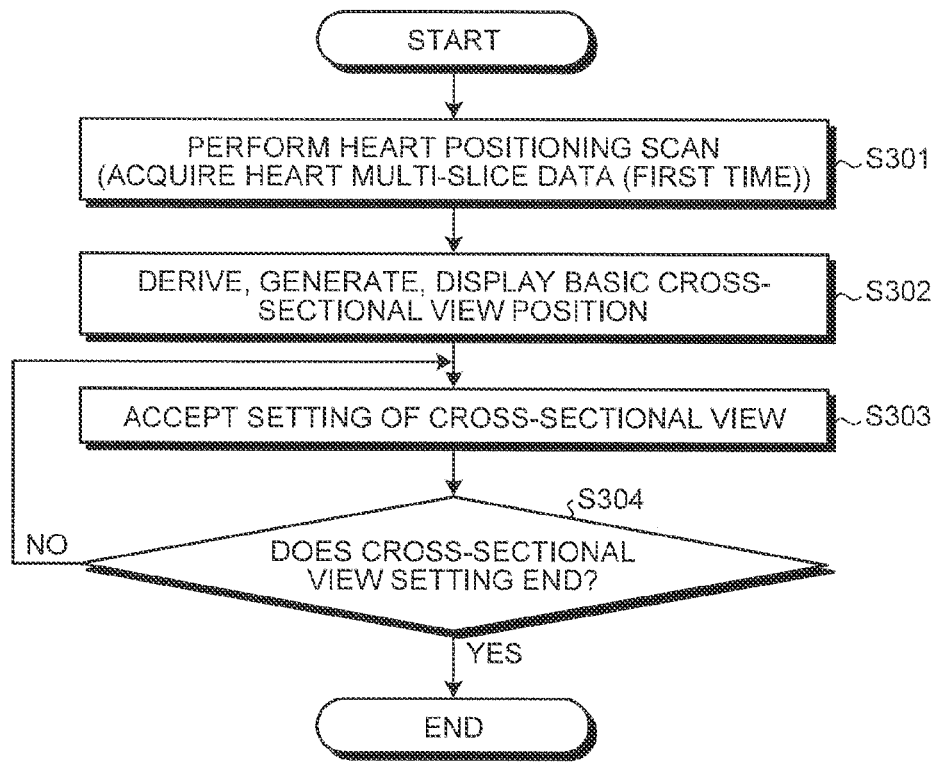
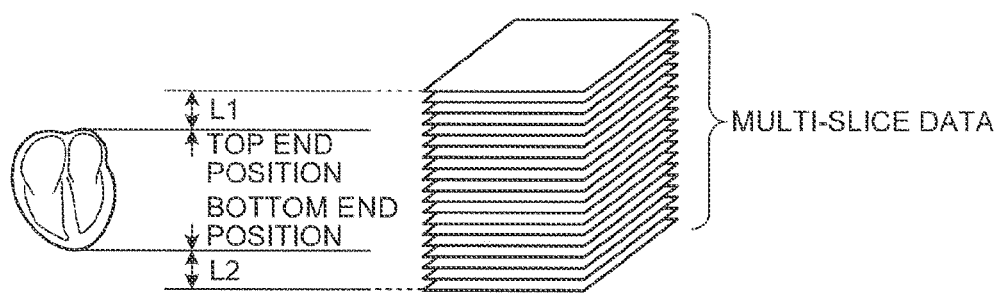

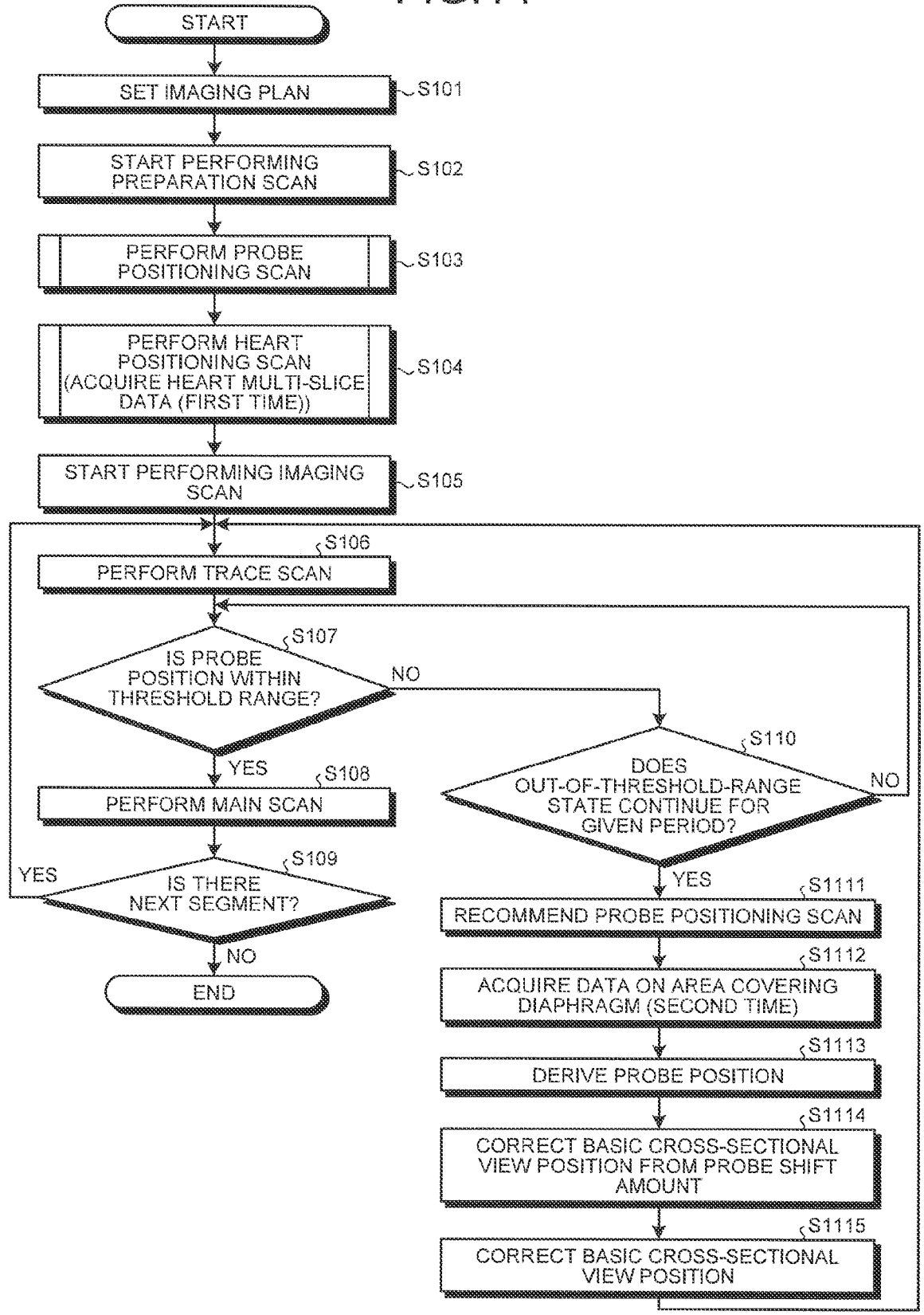

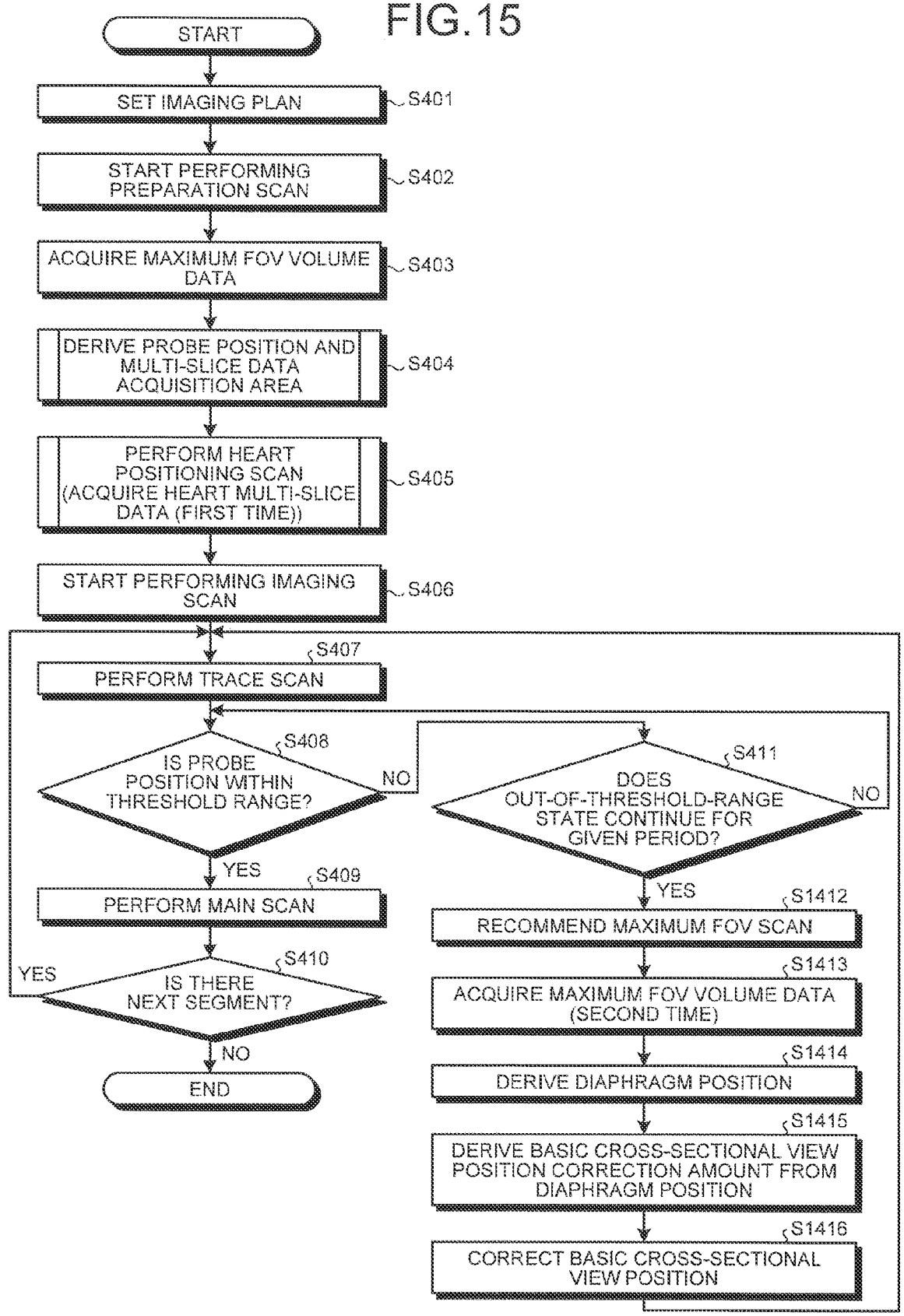

MAGNETIC RESONANCE IMAGING APPARATUS

CROSS-REFERENCE TO RELATED APPLICATIONS

This application is based upon and claims the benefit of priority from Japanese Patent Application No. 2013-249503, filed on Dec. 2, 2013; the entire contents of which are incorporated herein by reference.

FIELD

Embodiments described herein relate generally to a magnetic resonance imaging apparatus.

BACKGROUND

Magnetic resonance imaging is an imaging method in which nuclear spins of a subject placed in a static magnetic field are magnetically excited with RF (Radio Frequency) pulses at the Larmor frequency and an image is generated from the magnetic resonance signals that are generated in accordance with the excitation.

There is an imaging method, using the magnetic resonance imaging, of imaging the heart in accordance with the motion of the diaphragm corresponding to the breathing motion. In this method, an area to which motion detection pulses for detecting the motion of the diaphragm are applied is set in the diaphragm and, just before magnetic resonance signals corresponding to each echo or each segment are acquired from an imaging region of the heart, magnetic resonance signals are acquired from the area to which motion detection pulses are applied. The magnetic resonance signals that are acquired from the area to which motion detection pulses are applied are used to correct the imaging region of the heart or to determine the timing at which the heart is imaged.

BRIEF DESCRIPTION OF THE DRAWINGS

FIGS. 2A and 2B illustrate imaging of the heart according to the first embodiment;

FIG. 3 is a flowchart of an imaging procedure according to the first embodiment;

FIG. 4 is a flowchart of a procedure for positioning a probe according to the first embodiment;

FIG. 6 is a flowchart of a procedure for positioning a basic slice image of the heart according to the first embodiment;

FIG. 7 illustrates a region on which multi-slice data is acquired according to the first embodiment;

FIG. 14 is a flowchart of an imaging procedure according to a third embodiment; and FIG. 15 is a flowchart of an imaging procedure according to a fourth embodiment.

DETAILED DESCRIPTION

A magnetic resonance imaging apparatus according to an embodiment includes a processor and a memory. The memory stores processor-executable instructions that, when executed by the processor, cause the processor to perform an application region scan for acquiring data on an area covering a diaphragm in order to position an application region of a motion detection pulse and a multi-slice scan for acquiring first multi-slice data on an area covering a heart in order to position a slice image of the heart; and acquire the slice image of the heart that is positioned using the first multi-slice data, with application of the motion detection pulse, wherein, in acquiring the slice image, when breathing motion of a subject that is detected using the motion detection pulse is continuously out of an allowable range for a given period, the processor acquires second multi-slice data by performing the multi-slice scan again, and corrects, by calculation using the acquired second multi-slice data and a positional relationship obtained by the application region scan and the multi-slice scan that are performed by the preparation scan unit, a position of the application region of the motion detection pulse.

Magnetic resonance imaging apparatuses (hereinafter, "MRI apparatus") according to embodiments will be described below with reference to the accompanying drawings. Embodiments are not limited to the following embodiments. The content of descriptions for each embodiment can be similarly applied to other embodiments in principle.

First Embodiment

Figure 1:
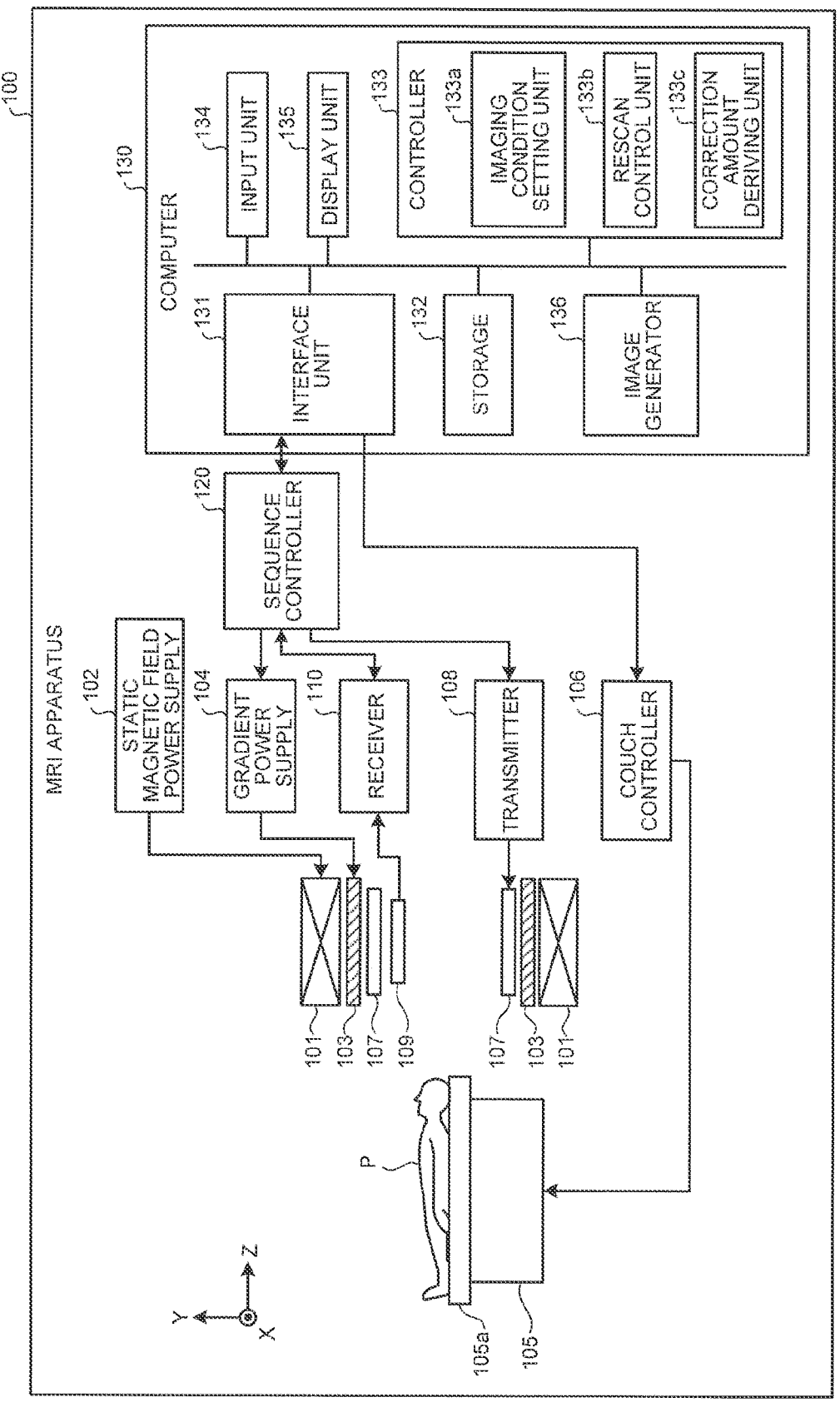
FIG. 1 is a functional block diagram of the configuration of an MRI apparatus according to a first embodiment.

FIG. 1 is a functional block diagram of the configuration of an MRI apparatus 100 according to a first embodiment. As shown in FIG. 1, the MRI apparatus 100 includes a static magnetic field magnet 101, a static magnetic field power supply 102, a gradient coil 103, a gradient power supply 104, a couch 105, a couch controller 106, a transmitter coil 107, a transmitter 108, a receiver coil 109, a receiver 110, a sequence controller 120, and a computer 130. The MRI apparatus 100 does not include a subject P (e.g. human body). The configuration shown in FIG. 1 is an example only. For example, each unit of the sequence controller 120 and the computer 130 may have an integrated or separated configuration as appropriate.

The static magnetic field magnet 101 is a magnet that is formed into a hollow cylinder and that generates a static magnetic field in the internal space. The static magnetic field magnet 101 is, for example, a superconducting magnet that is magnetically excited when supplied with an electric current from the static magnetic field power supply 102. The static magnetic field power supply 102 supplies an electric current to the static magnetic field magnet 101. The static magnetic field magnet 101 may be a permanent magnet. In such a case, the MRI apparatus 100 is not required to include the static magnetic field power supply 102. The static magnetic field power supply 102 may be provided separately from the MRI apparatus 100.

The gradient coil 103 is a coil that is formed in a hollow cylinder and that is arranged on the inner side with respect to the static magnetic field magnet 101. The gradient coil 103 is formed by combining three coils corresponding to X, Y and Z axes that are orthogonal to one another. Upon being supplied with an electric current individually from the gradient power supply 104, each of these three coils generates a gradient magnetic field where the magnetic field intensity changes along each of the X, Y and Z axes. The gradient magnetic fields of the X, Y and Z axes that are generated by the gradient coil 103 are, for example, a slice encode gradient magnetic field Gs, a phase encode gradient magnetic field Ge, and a read gradient magnetic field Gr. The gradient power supply 104 supplies an electric current to the gradient coil 103.

The couch 105 includes a couchtop 105a on which the subject P is placed and, under the control of the couch controller 106, the couchtop 105a with the subject P placed thereon is caused to enter the hollow (imaging port) of the gradient coil 103. Generally, the couch 105 is set such that the longitudinal direction is parallel to the center axis of the static magnetic field magnet 101. Under the control of the computer 130, the couch controller 106 derives the couch 105 to move the couchtop 105a along its longitudinal direction and vertically.

The transmitter coil 107 is arranged on the inner side with respect to the gradient coil 103 and generates a high-frequency magnetic field when supplied with RF pulses from the transmitter 108. The transmitter 108 supplies RF pulses corresponding to the Larmor frequency that is determined by the target atom type and magnetic field strength to the transmitter coil 107.

The receiver coil 109 is arranged on the inner side with respect to the gradient coil 103 and receives magnetic resonance signals (hereinafter, "MR signals" as required) that are emitted from the subject P due to the effects of the high-frequency magnetic field. Upon receiving MR signals, the receiver coil 109 outputs the received MR signals to the receiver 110.

The transmitter coil 107 and the receiver coil 109 described above are examples only. It is satisfactory if they consist of any one of or a combination of a coil with only a transmission function, a coil with only a reception function, and a coil having a transmission and reception functions.

The receiver 110 detects the MR signals that are output from the receiver coil 109 and generates MR data on the basis of the detected MR signals. Specifically, the receiver 110 generates MR data by performing digital conversion on the MR signals that are output from the receiver coil 109. The receiver 110 transmits the generated MR data to the sequence controller 120. The receiver 110 may be provided to a gantry that includes the static magnetic field magnet 101 and the gradient coil 103.

The sequence controller 120 images the subject P by driving the gradient power supply 104, the transmitter 108, and the receiver 110 according to sequence information that is transmitted from the computer 130. The sequence information is information that defines the imaging procedure. The sequence information defines the intensity of the electric current to be supplied by the gradient power supply 104 to the gradient coil 103, the timing at which the electric current is supplied, the strength of RF pulses to be supplied by the transmitter 108 to the transmitter coil 107, the timing at which RF pulses are supplied, and the timing at which the receiver 110 detects MR signals. For example, the sequence controller 120 is, for example, a circuitry, such as an integrated circuit, such as an ASIC (Application Specific Integrated Circuit) or an FPGA (Field Programmable Gate Array), or a processor, such as a CPU (Central Processing Unit) or an MPU (Micro Processing Unit).

Upon receiving the MR data from the receiver 110 after the subject P is imaged by driving the gradient power supply 104, the transmitter 108, the sequence controller 120 transfers the MR data to the computer 130.

The computer 130 controls the whole MRI apparatus 100, generates images, etc. The computer 130 includes an interface unit 131, a storage 132, a controller 133, an input unit 134, a display unit 135, and an image generator 136. The controller 133 includes an imaging condition setting unit 133a, a rescan control unit 133b, and a correction amount deriving unit 133c.

The interface unit 131 transmits sequence information to the sequence controller 120 and receives MR data from the sequence controller 120. Upon receiving the MR data, the interface unit 131 stores the received MR data in the storage 132. The MR data stored in the storage 132 is arrayed into a k-space by the controller 133. Accordingly, the storage 132 stores the k-space data.

The storage 132 stores the MR data that is received by the interface unit 131, the k-space data that is arrayed in the k-space by the controller 133, the image data that is generated by the image generator 136, etc. The storage 132 is, for example, a semiconductor memory device, such as a RAM (Random Access Memory) or a flash memory, a hard disk, an optical disk, etc. Further, the storage 132 stores, for example, processor-executable instructions for the sequence controller 120 and the controller 133. When executed by each controller, the instructions cause the controller to execute processes which are to be executed by the controller.

The input unit 134 accepts various instructions and information inputs from an operator. The input unit 134 includes, for example, a pointing device, such as a mouse or a trackball, or an input device, such as a keyboard. Under the control of the controller 133, the display unit 135 displays a GUI (Graphical User Interface) for accepting inputs of imaging conditions, images that are generated by the image generator 136, etc. The display unit 135 is, for example, a display device, such as a liquid crystal display device.

The controller 133 controls the whole MRI apparatus 100 and controls imaging, image generation, image display, etc. For example, the imaging condition setting unit 133a accepts inputs of imaging conditions on the GUI and generates sequence information according to the accepted imaging conditions. The imaging condition setting unit 133a transmits the generated sequence information to the sequence controller 120. For example, the controller 133 is, for example, a circuitry, such as an integrated circuit, such as an ASIC or an FPGA, or a processor, such as a CPU or an MPU. The processing performed by the imaging condition setting unit 133a, the rescan control unit 133b, and the correction amount deriving unit 133c will be described in detail below.

The image generator 136 generates an image by reading the k-space data from the storage 132, and performing reconstruction processing, such as Fourier transform, on the read k-space data.

FIGS. 2A and 2B illustrate imaging of the heart according to the first embodiment. The first embodiment employs an imaging method of imaging the heart according to the motion of the diaphragm corresponding to the breathing motion. This imaging method includes a method of correcting an imaging region of the heart (hereinafter, "body motion correction method") and a method of determining an imaging timing with the imaging region of the heart kept fixed (hereinafter, "body motion trigger method").

FIG. 2A is a timing chart of the body motion correction method and FIG. 2B is a timing chart of the body motion trigger method. First, common features between FIGS. 2A and 2B will be described below. The waveform shown in FIGS. 2A and 2B indicate the position of the diaphragm that moves up and down according to the breathing motion of the subject P. Regarding breathing phases at which inhaling and exhaling are repeated, the position of the diaphragm lowers with inhaling and the position of the diaphragm rises with exhaling. In both the cases shown in FIGS. 2A and 2B, a region to which motion detection pulses for detecting the motion of the diaphragm are applied (application region of the motion detection pulse) is set in the diaphragm and MR signals are acquired from the application region of the motion detection pulse just before MR signals corresponding to each echo or each segment are acquired from the imaging region of the heart. The box denoted with "MAIN SCAN" corresponds to acquisition from the imaging region of the heart and the boxes that are denoted with "TRACE SCAN" and arrayed just before the "MAIN SCAN" box correspond to acquisition from the application region of the motion detection pulse.

An example of the body motion correction method will be described using FIG. 2A. The body motion correction method is a method of detecting the motion of the diaphragm and correcting the imaging region of the heart. For example, in the body motion correction method, as shown in FIG. 2A, the repetition time (TR) that is the interval between main scans is generally kept constant and the number of trace scans repeated just before a main scan is also constant. In other words, in the motion correction method, the scanning is switched to a main scan after a given number of trace scans are performed with the TR kept constant generally and, if the position of the diaphragm that is detected in the last trace scan is within a threshold range (within the range from an upper limit value to a lower limit value), the MR signals that are acquired in the main scan are used to generate an image ("Correct" in FIGS. 2A and 2B). On the other hand, if the position of the diaphragm is out of the threshold range, MR signals are acquired in the main scan but are not used to generate an image ("Correct&Reject" in FIGS. 2A and 2B).

In the body motion correction method, the amount of a shift of the heart (shift amount of the heart) is estimated on the basis of the position of the diaphragm that is detected in real time and, on the basis of the estimated shift amount of the heart, the position of the imaging region in the main scan is corrected in real time.

An example of the body motion trigger method will be described using FIG. 2B. The body motion trigger method is a method of detecting the motion of the diaphragm and determining the imaging timing with the imaging region of the heart kept fixed. For example, as shown in FIG. 2B, the TR is secured for a given period but it does not mean that the TR is kept constant. Furthermore, the number of times of trace scans repeated just before a main scan is not constant. In other words, in the motion trigger method, after a given number of trace scans are performed, if the position of the diaphragm detected in the trace scan is within a threshold range (within the range from an upper limit value to a lower limit value), the scanning is switched to a main scan. If the TR for a given period is not secured even if the position of the diaphragm detected in the trace scan is within the threshold range, the scanning is not switched to a main scan.

In the body motion trigger method, different from the body motion correction method, the position of the imaging region in the main scan is not corrected in principle because the breathing phase at the main scan is generally constant.

In any of the motion correction method and the body motion trigger method, main scans may be performed in synchronization with electrocardiographic (ECG) signals. In other words, in this case, only MR signals that are acquired at timings at which both desired breathing and cardiac phases are met are used to generate an image. The threshold range determined by the upper and lower limit values is adjusted as appropriate according to the relationship with the desired image quality. FIGS. 2A and 2B illustrate an example where main scans are performed during the exhaling period. However, embodiments are not limited to this. Main scans may be performed during the inhaling period.

FIG. 3 is a flowchart of an imaging procedure according to the first embodiment. As shown in FIG. 3, in the first embodiment, first, the imaging condition setting unit 133a accepts a setting for an imaging plan from an operator (step S101). For example, the imaging condition setting unit 133a previously stores information on a pulse sequence in which default values are set for imaging parameters, such as TR and echo time (TE). The information on the pulse sequence is managed, for example, with respect to each of imaging regions or imaging purpose and in each of a plurality of sets of pulse sequence groups. The imaging condition setting unit 133a presents the sets of pulse sequence groups to the operator and accepts selection or change from the operator via the GUI and accordingly determines a pulse sequence group and imaging parameters to be performed in an objective examination.

According to the imaging plan that is accepted by the imaging condition setting unit 133a, the sequence controller 120 starts performing a preparation scan (step S102). The preparation scan (also referred to as "preparation imaging") is a scan that is performed prior to an imaging scan for acquiring an image to be used for diagnosis (also referred to as "main imaging"). The preparation scan includes a scan for acquiring a sensitivity map of the receiver coil 109 and a scan for shimming.

In the first embodiment, in the preparation scan, a scan for positioning motion detection pulses (an application region scan) (step S103) and a scan for positioning a basic slice image (cross-sectional image) of the heart (a multi-slice scan) (step S104) are performed. These two types of scan may be performed in the reverse order but it is preferable that the two types of scan be performed consecutively such that the position of the positioned motion detection pulses and the position of the heart after the motion detection pulses are positioned can be stored in association with each other correctly.

In the first embodiment, a "1D motion probe" is employed as a method of detecting the breathing motion and thus motion detection pulses are referred to as a "probe". In this method, the sequence controller 120 detects the position of the diaphragm by performing one-dimensional Fourier transform on MR signals that are acquired by performing trace scans.

Figure 5A:
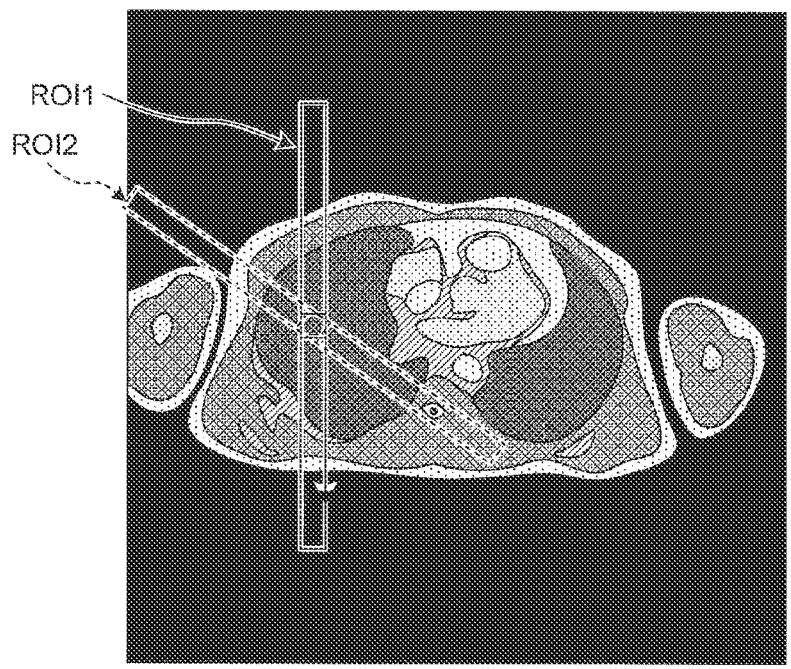
FIGS. 5A and 5B illustrate positioning of a probe according to the first embodiment.
Figure 5B:
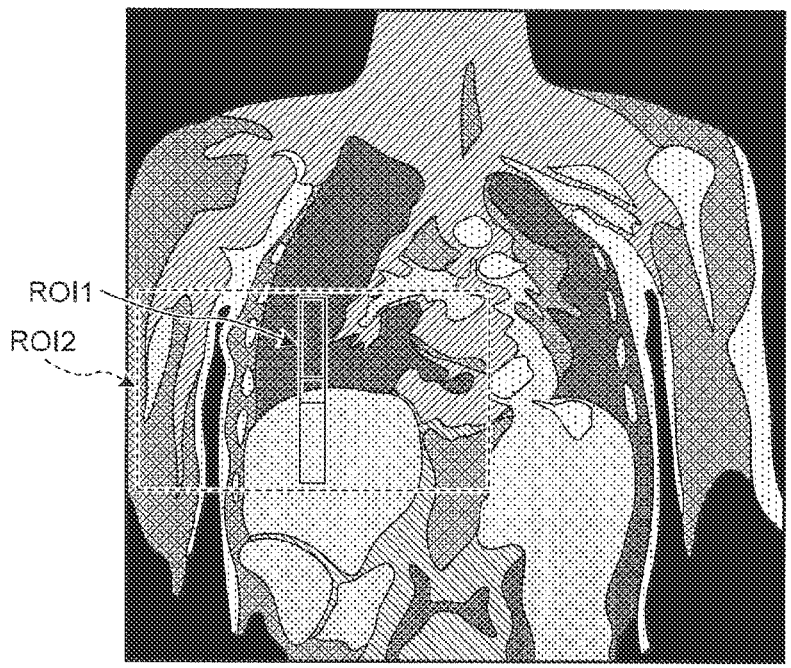

FIG. 4 is a flowchart of a procedure for positioning a probe according to the first embodiment. FIGS. 5A and 5B illustrate positioning of a probe according to the first embodiment. As shown in FIG. 4, the sequence controller 120 first performs a positioning scan for positioning the probe to acquire an axial image and a coronal image covering the diaphragm as positioning images (step S201).

As shown in FIGS. 5A and 5B, the imaging condition setting unit 133a then displays, on the GUI, the positioning images that are acquired at step S201 (step S202) and accepts a setting for the position of an application region of the motion detection pulse, i.e., the position of the probe (probe position), from the operator (step S203). Here, for example, the imaging condition setting unit 133a stores, in the storage 132, the information representing the set probe position. For example, the imaging condition setting unit 133a displays an axial image and a coronal image where the diaphragm (the upper edge of the lever) is at the highest position from among a plurality of coronal images on the GUI as positioning images.

FIG. 5A represents an axial image and FIG. 5B represents a coronal image. In the first embodiment, a two-plane crossing method in which an excitation pulse (90° pulse) and a refocus pulse (180° pulse) for the SE (Spin Echo) imaging are caused to cross to excite the area of a quadrangular prism is employed as a method of applying the probe. For this reason, the imaging condition setting unit 133a accepts a setting for an ROI1 that is an area to which 90° pulses are applied and a setting for an ROI2 that is an area to which 180° pulses are applied. It is preferable that the ROI1 and ROI2 be set such that the ROI1 and the ROI2 do not overlap the imaging region of the heart because, if the application regions overlap the imaging region of the heart, an artifact may occur in the image of the heart due to the relation to the recovery of longitudinal magnetization. It is also preferable that, for example, the ROI1 and ROI2 be set such that the center point of the area of a quadrangular prism where the ROI1 and ROI2 cross each other is positioned at the apex of the convex surface of the right diaphragm.

Thereafter, as shown in FIG. 4, the sequence controller 120 performs an experimental trace scan of the probe on the basis of the probe position that is set at step S203 (step S204). The sequence controller 120 determines whether the probe position is within the threshold range shown in FIGS. 2A and 2B (step S205) and, when the probe position is within the threshold range (YES at step S205), proceeds to the processing at step S104 shown in FIG. 3.

On the other hand, when the probe position is out of the threshold range (NO at step S205), the sequence controller 120 further determines whether the state where the probe position is out of the threshold range continues for a given period (step S206). When the state continues for the given period (YES at step S206), the sequence controller 120 makes a fine adjustment and proceeds to the processing at step S104 shown in FIG. 3 (step S207). The fine adjustment may be made by the operator manually or may be made automatically. For example, the sequence controller 120 updates, with the adjusted probe position, the information representing the probe position that is stored in the storage 132. A part of the processing shown in FIG. 4 may be performed not by the sequence controller 120 but by the controller 133.

The following description refers back to FIG. 3. The sequence controller 120 then performs a scan for positioning a basic slice image of the heart (step S104).

Figure 8:
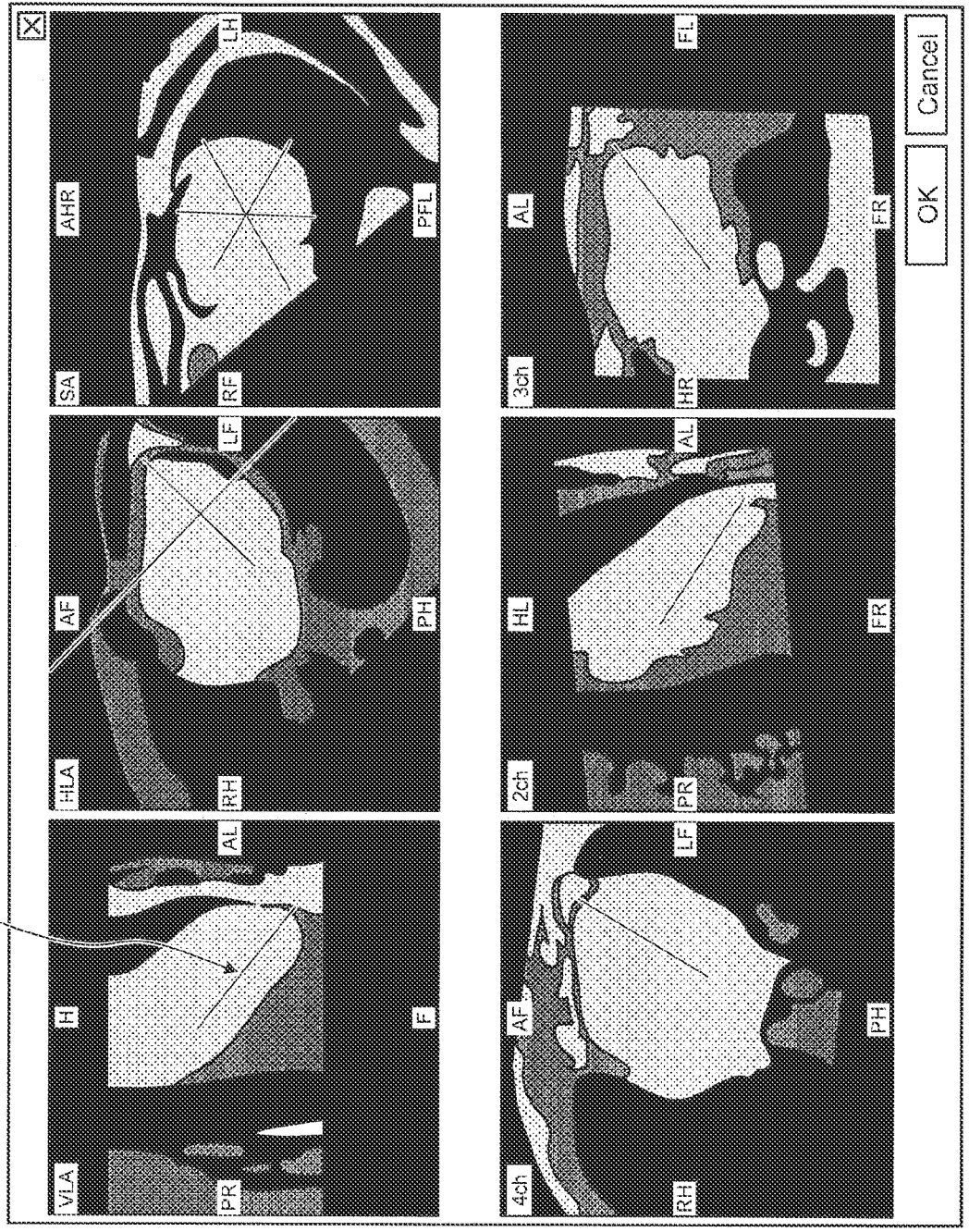
FIG. 8 illustrates positioning of a basic slice image of the heart according to the first embodiment.

FIG. 6 is a flowchart of a procedure for positioning a basic slice image of the heart according to the first embodiment, FIG. 7 illustrates a region on which multi-slice data is acquired (acquisition region of multi-slice data) according to the first embodiment, and FIG. 8 illustrates positioning of a basic slice image of the heart according to the first embodiment. First, the sequence controller 120 performs a positioning scan for positioning a basic slice image of the heart to acquire multi-slice data on the heart (step S301). Multi-slice data is acquired twice and FIG. 6 clearly shows that it is the acquisition of multi-slice data for the first time.

The sequence controller 120 acquires multi-slice data according to the pre-set acquisition region. As illustrated in FIG. 7, it is desirable that the acquisition region in the slice direction from among acquisition regions be determined by the position at which an offset L1 extending from the top end of the heart toward the head is defined and the position at which an offset L2 extending from the bottom end of the heart toward the head is defined. In the first embodiment, the sequence controller 120 acquires multi-slice data in synchronization with the ECG signals. In other words, the sequence controller 120 applies excitation pulses using ECG signals as trigger signals, and acquires MR signals corresponding to one slice for a plurality of times. In this case, it is desirable that the sequence controller 120 finish acquiring MR signals corresponding to one slice within one heart rate period (e.g. within 1RR). Furthermore, it is desirable that the sequence controller 120 acquire each slice be with the delay from the trigger signal (e.g. R-wave) kept constant.

The image generator 136 then reconstructs a plurality of axial images along the body axis of the subject P from the multi-slice data to generate volume data. For example, the volume data is a group of 20 axial images that are reconstructed by the image generator 136. The image generator 136 may perform isotopic processing (interpolation processing so as to provide equal intervals in three x, y, z directions) on the reconstructed volume data and then provide the resultant data as volume data to the following processing. Alternatively, the image generator 136 may provide volume data to which no isotopic processing is performed to the following processing.

The imaging condition setting unit 133a derives, for example, the positions of six types of basic slice images from the volume data and, according to the derived positions, generates and displays six types of slice images from the volume data (step S302). The position of a basic slice image is a spatial position of the basic slice image in a three-dimensional image space and is represented by a parameter that can uniquely specify the basic slice image from the volume data. For example, the parameter is represented by the coordinate points of the center of the basic slice image (e.g. the center of the left ventricle) and two vectors (e.g. the short axis and long axis) on the basic slice image. The six types of slice images are generated as positioning images for images that are acquired in the following imaging scan. For example, as shown in FIG. 8, the imaging condition setting unit 133a displays, as positioning images, a vertical long axis (VLA) image, a horizontal long axis (HLA) image, a left-ventricle short axis (SA) image, a four-chamber (4ch) slice image, a two-chamber (2ch) slice image, and a three-chamber (3ch) slice image side by side. As shown in FIG. 8, the imaging condition setting unit 133a may display information of crossing lines between each slice image and another slice image such that the information is superimposed onto each slice image.

The following description refers back to FIG. 6. The imaging condition setting unit 133a accepts settings for the six types of basic slice images from the operator on the basic slice images (step S303) and, when the settings for all the basic slice images end (YES at step S304), proceeds to the processing at step S105 shown in FIG. 3. The operator browses the displayed basic slice images, confirms whether proper basic slice images are set for images that are acquired in the imaging scan, adjusts the positions of the basic slice images as required, etc. Here, for example, the imaging condition setting unit 133a stores information representing the positions of the basic slice images that are set or adjusted in the storage 132. FIG. 8 illustrates the case where six types of basic slice images are generated and displayed. However, embodiments are not limited to this. The number and type of slice images that are generated as positioning images may be changed arbitrarily.

The following description refers back to FIG. 3. When the series of scans in the preparation scan ends, the sequence controller 120 starts performing an imaging scan (step S105).

Although there is a slight difference between the body motion correction method and the body motion trigger method, in the first embodiment, the sequence controller 12 performs trace scans (step S106) just before performing a main scan and, and when the probe position is within a threshold range (YES at step S107), performs the main scan subsequently (step S108). When performing the main scan, the sequence controller 120 determines whether there is the next segment (step S109). When there is the next segment (YES at step S109), the sequence controller 120 performs trace scans again.

In the trace scans during the imaging scan, the probe position is not necessarily within the threshold range soon (step S107) and the state where the probe position is out of the threshold range may continue for a given period (YES at step S110). The reason for this may be that the body of the subject P shifts because, for example, the subject coughs after the probe is positioned. In such a case, with a conventional method, the probe is repositioned. However, in the first embodiment, as described below, by performing a scan for positioning the heart for the second time, the probe is repositioned by internal calculation processing.

In other words, for example, while the sequence controller 120 is performing trace scans, the rescan control unit 133b determines whether the state where the probe position is out of the threshold range continues for the given period (step S110). When the state continues for the given period (YES at step S110), for example, the rescan control unit 133b displays information giving a recommendation to perform a heart positioning scan on the GUI (step S111). For example, the rescan control unit 133b displays, on the GUI, a recommendation "Acquire multi-slice data on the heart" or a recommendation "Perform xx" by directly specifying an application name. The processing at step S111 may be omitted by automation of starting of acquisition of multi-slice data on the heart.

When receiving an acceptance from the operator, the rescan control unit 133b controls the sequence controller 120 to acquire multi-slice data for the second time (step S112). The correction amount deriving unit 133c then generates volume data from multi-slice data and derives the positions of the six types of basic slice images from the volume data (step S113).

The correction amount deriving unit 133c compares the positions of the basic slice images derived at step S104 and the positions of the basic slice images derived at step S113 to derive the shift amount of the heart and, from the shift amount, derives an amount by which the position of the probe is to be corrected (correction amount for the probe position) (step S114). Here, for example, the correction amount deriving unit 133c reads the information representing the positions of the basic slice images stored in the storage 132 and compares the positions represented by the read information and the positions of the basic slice images that are derived at step S113.

Figure 9A:
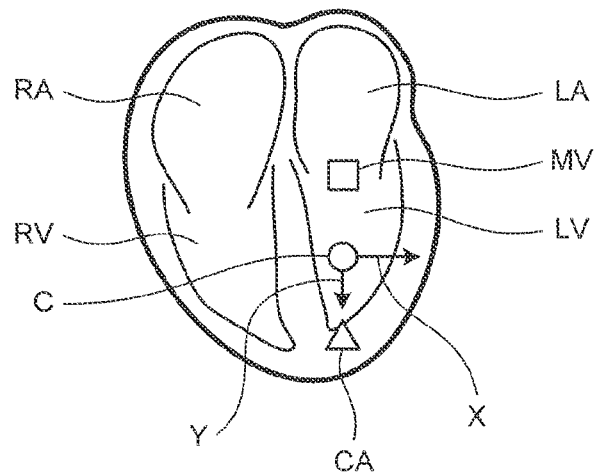
FIGS. 9A and 9B illustrate how to derive a correction amount according to the first embodiment.
Figure 9B:
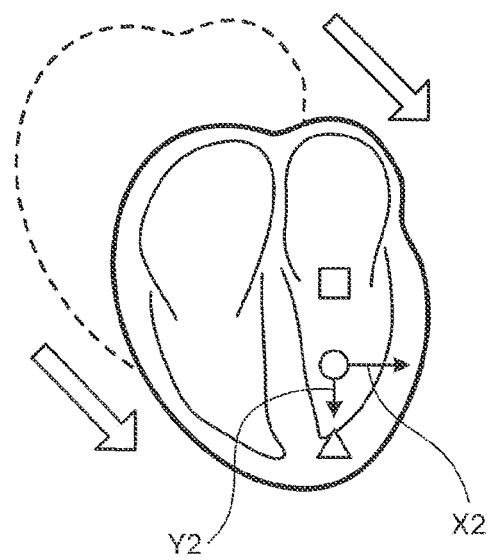

FIGS. 9A and 9B illustrate how to derive the correction amount according to the first embodiment. FIGS. 9A and 9B illustrate exemplary 4ch slice images. As shown in FIG. 9A, the 4ch slice image is a slice image that shows all the four chambers (the left ventricle (LV), the left atrium (LA), the right ventricle (RV), and the right atrium (RA)), and that passes through the mitral valve (MV) and the cardiac apex (CA) which are characteristic regions of the heart. "C" illustrated in FIG. 3 denotes the region referred to as the "LV center" that is positioned at the midpoint between the MV and the CA. The vector extending from the LV center (C) toward the CA is referred to as the "long axis Y" and the vector orthogonal to the long axis Y on the 4ch slice image is referred to as the "short axis X".

For example, as illustrated in FIGS. 9A and 9B, the correction amount deriving unit 133c compares the short axis X and the long axis Y in the 4ch slice image derived at step S104 and a short axis X2 and a long axis Y2 in the 4ch slice image derived at step S113 to derive the shift amount of the heart. The short axis X and the long axis Y (see FIG. 9A) and the short axis X2 and the long axis Y2 (see FIG. 9B) are all derived with absolute coordinates (3D coordinates) of a patient coordinate system or an apparatus coordinate system and accordingly, when the subject P moves, the amount of the shift appears as a difference between the values at the sets of coordinates. Supposing that the direction and amount of the shift of the probe position equal to those of the heart, the correction amount deriving unit 133c derives a correction amount for the probe position. It is preferable that, if the corrected probe position overlaps the basic slice image of the heart, the correction amount deriving unit 133c further adjust the corrected probe position such that the probe position and the basic slice image do not overlap.

The patient coordinate system will be further described here. When the MRI apparatus 100 performs imaging, the light of the projector is applied to the subject P when the couchtop 105a is inserted into the gantry. The operator makes an input to specify the position of the region to be imaged (e.g. the heart) via the input unit 134 at the timing when the light of the projector is applied to the region to be imaged. The couch controller 106 then moves the couchtop 105a such that the region to be imaged is positioned at the center of the magnetic field. For example, the original point of the patient coordinate system is the point at which the light of the projector is applied and which is positioned at the center of the magnetic field, and even if the subject P moves, the original point does not shift.

The direction of each coordinate axis in the patient coordinate system is defined according to the direction of the subject P on the couchtop 105a being inserted into the gantry. The direction of the subject P is, for example, input by the operator with imaging conditions. For example, the direction of the subject P is represented by the direction in which the patient P is inserted into the gantry and head-first (representing that the head is inserted first) or foot first (representing that the foot are inserted first) is input. Alternatively, for example, the direction of the subject P is represented by the upper part of the subject P being inserted into the gantry, and any one of anterior, posterior, right, and left is input.

The following description refers back to FIG. 3. The sequence controller 120 corrects the probe position determined at step S103, using the correction amount for the probe position that is derived at step S114, (step S115) and returns to the processing at step S106 to perform a trace scan again. Here, for example, the sequence controller 120 corrects the information representing the probe position stored in the storage 132, using the correction amount derived at step S114.

In the multi-slice data acquisition at step S104, according to the derived positions of the basic slice images, slice images are generated from volume data and displayed and then settings for the basic slice images are accepted from the operator. These operations can be omitted in the second acquisition. In other words, at the second acquisition, the positions of the basic slice images can be corrected by internal processing on the basis of the shift amount of the heart derived at step S114, without any setting by the operator.

The method has been described where the shift amount of the heart is derived from the amount of the shift of the short axis X and the long axis Y of the 4ch slice image. However, embodiments are not limited to this. For example, the shift amount of the heart may be derived from the shift amount of another characteristic of another basic slice image. Alternatively, shift amounts of a characteristic in a plurality of basic slice images may be used in combination.

As described above, in the first embodiment, the sequence controller 120 acquires multi-slice data on an area covering the heart for the first time during the preparation scan. Furthermore, the sequence controller 120 acquires slice images of the heart during the imaging scan, with application of motion detection pulses for detecting the breathing motion. Furthermore, when the berating motion detected using the motion detection pulses is out of the threshold range for the given period, the sequence controller 120 acquires multi-slice data for the second time. The correction amount deriving unit 133c compares the positions of the basic slice images derived from the first multi-slice data and the positions of the slice images derived from the second multi-slice data to derive the shift amount of the heart and, from the derived shift amount, derives an correction amount for the position of the application region of the motion detection pulse (probe position).

As described above, according to the first embodiment, even when the probe position shifts according to the shift of the subject P and thus a trace scan cannot be performed normally, by performing a heart positioning scan for the second time and comparing the result of the second scan with the result of the first scan, the probe can be repositioned by internal calculation processing. As a result, according to the first embodiment, the probe position can be repositioned easily. The above-described heart positioning scan is characterized not in positioning with an operation with operator's check by sight but in deriving, from the acquired data, the positions of basic slice images by internal calculation processing. For this reason, by performing a heart positioning scan for the second time and comparing the result of the first heart positioning scan with the result of the first heart positioning scan, the probe can be repositioned by the internal calculation processing.

Second Embodiment

A second embodiment will be described here. For the first embodiment, the case has been described where a scan for positioning the probe and a scan for positioning a basic slice image of the heart are consecutively performed such that the probe position which is positioned and the position of the heart upon the positioning of the probe are stored in association with each other correctly. In other words, in the method of the first embodiment, the relative positional relationship between the probe position and the heart position are not taken from the same data and, on the assumption that the shift amount of the heart is equal to the correction amount for the probe position under the condition that the two scans are performed almost at the same time, the shift amount of the heart is directly applied to correct the probe position.

On the other hand, in the second embodiment, different from acquisition of multi-slice data, data on a wide-area covering both the diaphragm and the heart is acquired previously and, from the wide-area data, the relative positional relationship between the positions of the diaphragm and the heart is specified. In other words, in the method of the second embodiment, the relative positional relationship between the probe position and the heart position is acquired from the same data. In this case, when the position of a basic slice image of the heart after a shift of the subject P is made clear, the probe position can be directly determined using the relative positional relationship with the heart.

From a different viewpoint, it is not ensured that the subject P does not definitely move between the scan for positioning the probe and the scan for positioning the basic slice image of the heart and, in this respect, the probe can be repositioned more accurately in the second embodiment.

Figure 10:
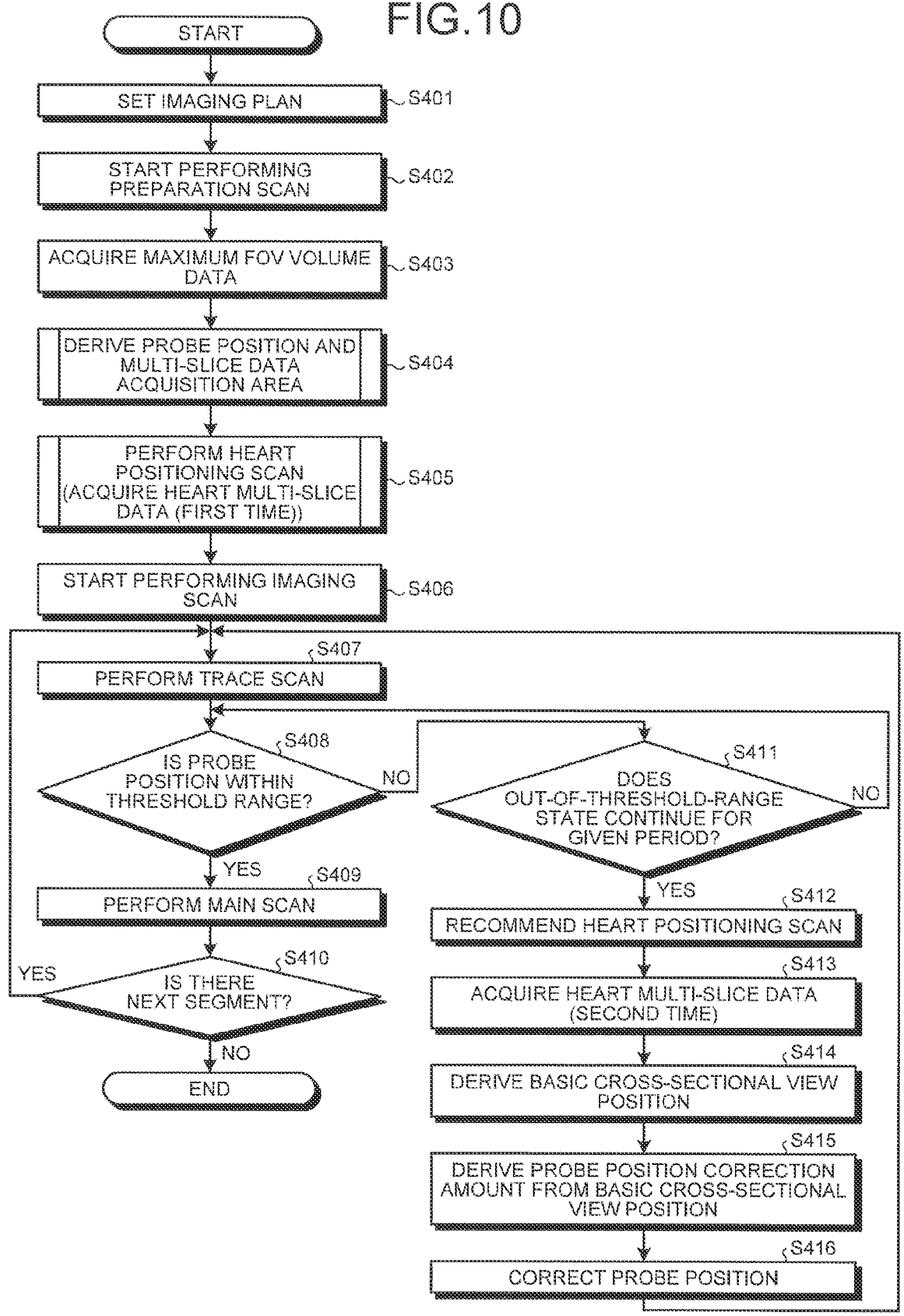
FIG. 10 is a flowchart of an imaging procedure according to a second embodiment.

FIG. 10 is a flowchart of an imaging procedure according to the second embodiment. FIG. 3 representing the first embodiment and FIG. 10 representing the second embodiment will be compared to each other and the different aspect between them will be described mainly here. In the second embodiment, as shown in FIG. 10, no scan for positioning a probe is performed and, instead, a scan for acquiring volume data of a maximum field of view (FOV) (maximum FOV scan) is performed (step S403).

Here, the volume data of the maximum FOV is 3D MR data that is acquired at the maximum FOV about the magnetic field center that can be set by the MRI apparatus 100 (e.g. the area in which the evenness of the static field intensity can be secured). Because the volume data is used to derive the probe position and the acquisition region of the multi-slice data, it is necessary to acquire the volume data on an area covering the landmark that is used to derive each position. For example, in the second embodiment, the volume data on an area covering the apex of the convex surface of the right diaphragm and the heart is acquired.

Figure 11:
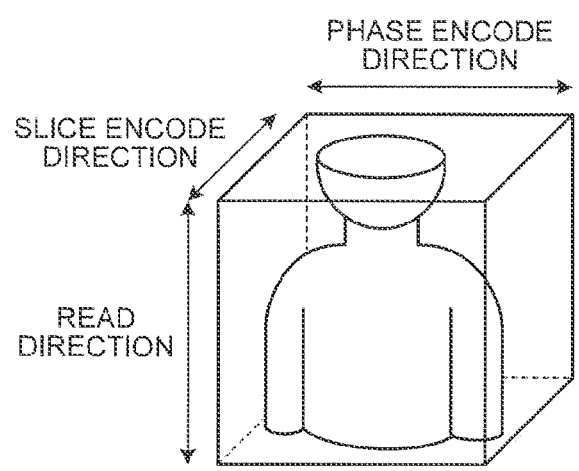
FIG. 11 illustrates maximum FOV volume data according to the second embodiment.

FIG. 11 illustrates the maximum FOV volume data according to the second embodiment. For example, as illustrated in FIG. 11, the sequence controller 120 sets the head-foot direction for the reading direction, sets the left-right direction for the phase encode direction, sets the dorsoventral direction for the slice encode direction, and acquires 3D MR data at the maximum FOV that can be set by the MRI apparatus 100. By setting the head-foot direction for the reading direction, the resolution in the head-foot direction can be enhanced. Regarding the position of the diaphragm and the position of the heart, the image characteristics on a coronal slice image are most effective both in automatic detection and in checking the result of the detection. As for the two directions, i.e., the head-foot direction and the left-right direction, on a coronal slice image, the left-right direction has much less effects of the aliasing outside the imaging region. For this reason, it is desirable that the volume data be acquired by using a combination of the above-described encode directions.

The following description refers back to FIG. 10. Using the maximum FOV volume data that is acquired at step S403, the imaging condition setting unit 133a derives a probe position and an acquisition region of multi-slice data (step S404).

Figure 12:
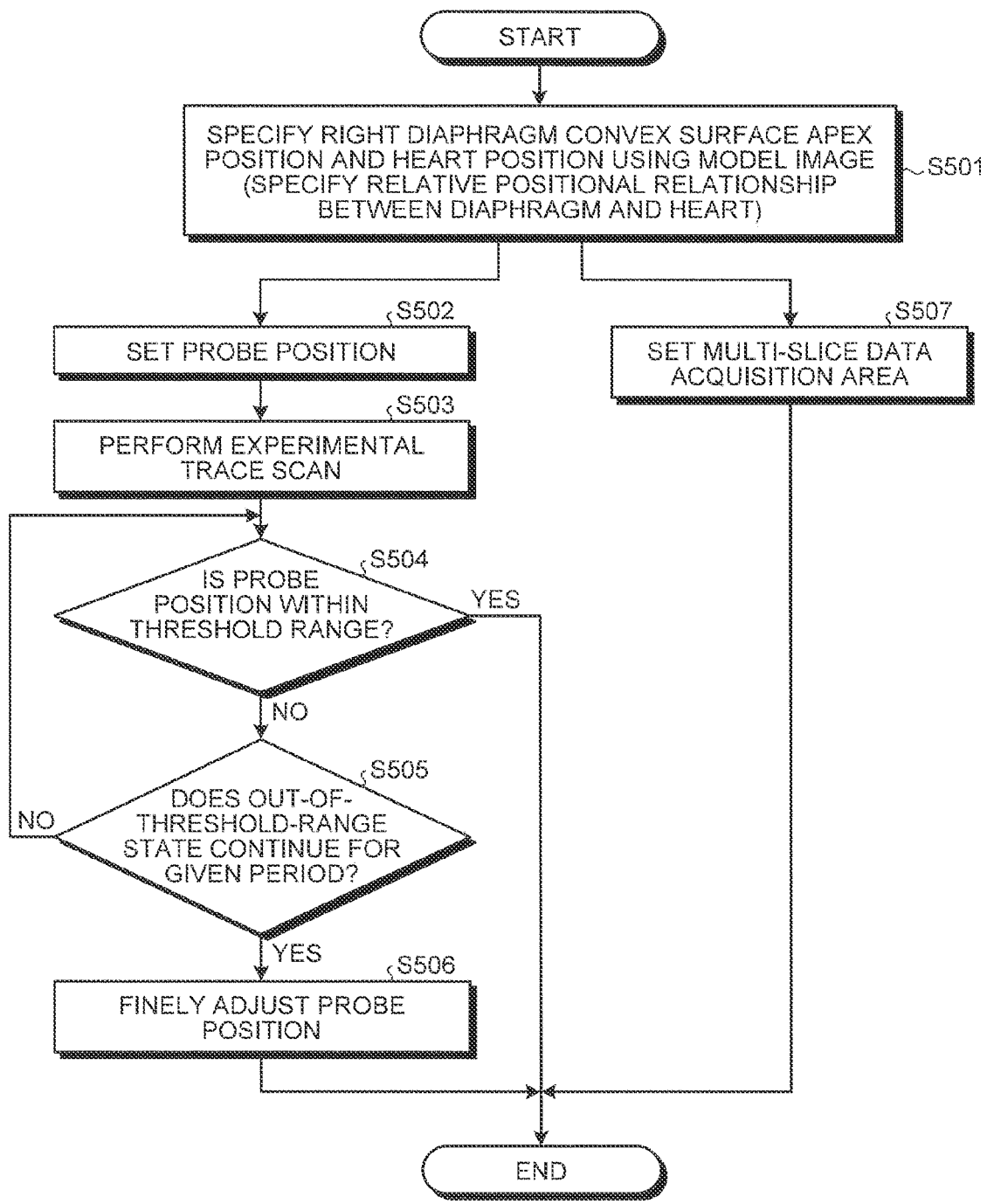
FIG. 12 is a flowchart of a procedure for deriving the position of a probe and a region on which multi-slice data is acquired.

FIG. 12 is a flowchart of a procedure for deriving a probe position and an acquisition region of multi-slice data. As shown in FIG. 12, the imaging condition setting unit 133a uses a model image to specify, for example, the position of the apex of the convex surface of the right diaphragm and the position of the heart (e.g. the position of the whole heart or a characteristic of the heart, e.g., the mitral valve, the cardiac apex, or the center of the left ventricle) (step S501). For example, the imaging condition setting unit 133a stores information representing the relative positional relationship between the specified diaphragm and the heart in the storage 132. The model image is an image (MR image) that is acquired by previously imaging a subject P (e.g. a typical patient) using the MRI apparatus 100. Embodiments are not limited to this. For a model image, for example, an average image from images obtained by imaging a plurality of patients may be used. Alternatively, a model image may be an image that is obtained by performing image processing.

A method of specifying those positions from the maximum FOV volume data using a model image will be described here. On the model image, the position of the apex of the right diaphragm and the position of the heart (e.g., the position of the top end or the bottom end of the heart, the mitral valve, the cardiac apex, or the center of the left ventricle) can be seen. Thus, the imaging condition setting unit 133a, for example, performs image processing for rigid-body or non-rigid-body transformation on the maximum FOV volume data such that the maximum FOV volume data matches the model image and, on the transformed maximum FOV volume data, specifies the position of the apex of the convex surface of the right diaphragm and the position of the heart. Thereafter, the imaging condition setting unit 133a performs image processing for reverse transformation from the maximum FOV volume data to the original maximum FOV volume data and specifies the position of the apex of the convex surface of the right diaphragm and the position of the heart on the reverse-transformed maximum FOV volume data. Embodiments are not limited to this. The imaging condition setting unit 133a may perform image processing for rigid-body or non-rigid-body transformation on a model image such that the model image matches the maximum FOV volume data.

Figure 13:
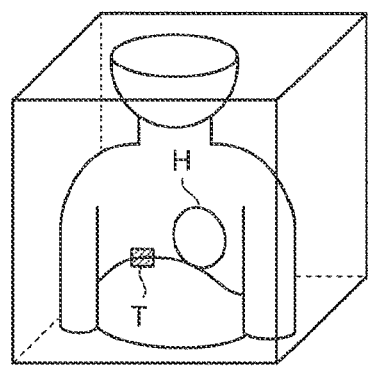
FIG. 13 illustrates a relative positional relationship between the diaphragm and the heart according to the second embodiment.

FIG. 13 illustrates the relative positional relationship between the diaphragm and the heart according to the second embodiment. By specifying each of the position T of the apex of the convex surface of the right diaphragm and the position H of the heart (FIG. 13 illustrates the position of the whole heart only), the imaging condition setting unit 133a specifies the relative positional relationship between the position of the apex of the convex surface of the right diaphragm and the position of the heart. By specifying the relative positional relationship between the position of the apex of the of the convex surface of the right diaphragm and the position of the heart from the same maximum FOV volume data in this manner, as described below, the correction amount deriving unit 133c can directly derive the position of the probe after the move of the subject P on the basis of the position of the basic slice image of the heart that is derived for the second time.

The following description refers back to FIG. 12. The imaging condition setting unit 133a sets the probe position on the basis of the position of the apex of the convex surface of the diaphragm specified from the maximum FOV volume data (step S502). For example, the size of the cuboid 90° pulse application region (ROI1) and the size of the cuboid 180° pulse application region (ROI2) are predetermined. Thus, for example, the imaging condition setting unit 133a sets the cuboid application regions ROI1 and ROI2 whose sizes are predetermined such that the apex T of the convex surface of the right diaphragm is positioned at the center of the quadrangular prism of the crossing.

The following steps S503 to S506 are the same as those at steps S204 to S207 illustrated using FIG. 4 for the first embodiment. In both the first and second embodiments, the experimental trace scan processing on the probe may be omitted.

As shown in FIG. 12, the imaging condition setting unit 133a sets an acquisition region of multi-slice data on the basis of the positions of the top and bottom ends of the heart that are specified from the maximum FOV volume data (step S507). For example, the imaging condition setting unit 133a sets, for the acquisition region in the slice direction, an area that is determined by the position at which an offset L1 from the position of the top end of the heart toward the head is taken and the position at which an offset L2 from the position of the bottom end of the heart toward the foot is taken.

The following description refers back to FIG. 10. The sequence controller 120 performs a scan for positioning the heart according to the acquisition region of the multi-slice data that is derived at step S404 (step S405) and starts performing an imaging scan as in the case of the first embodiment (step S406).

Here, an aspect different from the first embodiment will be described here. In the first embodiment, at step S114, the correction amount deriving unit 133c compares the position of a basic slice image derived at step S104 and the position of the basic slice image derived at step S113 to derive the shift amount of the heart and, from the shift amount, derives a correction amount for the probe position. On the other hand, in the second embodiment, at step S415, the correction amount deriving unit 133c directly calculates a correction amount for the probe position, using the relative positional relationship between the diaphragm and the heart derived from the maximum FOV volume data and the position of the basic slice image derived at step S414. Here, for example, the correction amount deriving unit 133c reads information representing the relative positional relationship between the diaphragm and the heart stored in the storage 132 and, using the read positional relationship and the position of the slice image derived at step S414, calculates a correction amount for the probe position.

In other words, the correction amount deriving unit 133c does not apply the shift amount of the heart directly to correct the probe position on the assumption that the shift amount of the heart is equal to the correction amount for the probe position, but derives, as the probe position after the shift, a position distant from the heart after the shift by a given distance and in a given direction. It is preferable that, if the corrected probe position overlaps the basic slice image of the heart, the correction amount deriving unit 133c further adjust the corrected probe position such that the probe position and the basic slice image do not overlap.

In this manner, according to the second embodiment, because the relative positional relationship between the probe position and the position of the heart is known from the same data, an error caused because the subject P moves while the relative positional relationship between the probe position and the position of the heart is specified can be eliminated and accordingly the probe can be repositioned more accurately.

For the second embodiment, the example has been described where a scan for acquiring the maximum FOV volume data is performed instead of the probe positioning scan and, on the basis of the volume data, the probe position is automatically set. However, embodiments are not limited to this. For example, different from the scan for acquiring the maximum FOV volume data, the probe positioning scan may be performed as in the case of the first embodiment and the first probe positioning may be performed by a user's operation as in the case of the first embodiment.

Furthermore, for the first and second embodiments, the example has been described where the position of the application region of the motion detection pulse is corrected by re-performing the multi-slice scan again from among the application region scan and multi-slice scan that are performed in the preparation scan. Hoverer, embodiments are not limited to this. For example, as in the case of third and fourth embodiments described below, the position at which the slice image of the heart is imaged (imaging position of the slice image of the heart), which is acquired in the main scan, may be corrected by performing an application region scan again.

Third Embodiment

A third embodiment will be described here. For the first embodiment, the example has been described where, when the breathing motion of a subject that is detected using motion detection pulses is continuously out of an allowable range for a given period, a multi-slice scan is performed again to correct the position of the application region of the motion detection pulse.

On the other hand, for the third embodiment, a case will be described where the breathing motion of a subject that is detected using motion detection pulses is continuously out of an allowable range for a given period, a probe positioning scan (application region scan) is performed again to correct the position at which a slice image of the heart acquired in the main scan is corrected. In the third embodiment, the position of an application region of the motion detection pulse acquired from the data acquired by performing an application region scan that is performed during a preparation scan and the position of the application region of the motion detection pulse acquired from the data acquired by performing an application region scan again to derive the shift amount of the motion detection pulse and, from the shift amount, derives an amount by which the imaging position of the slice image of the heart is to be corrected (correction amount for the imaging position of the slice image of the heart).

FIG. 14 is a flowchart of an imaging procedure according to the third embodiment. FIG. 3 representing the first embodiment and FIG. 14 representing the third embodiment will be compared to each other and the different aspect between them will be mainly described.

In the third embodiment, as shown in FIG. 14, in a trace scan during an imaging scan, when the state where the probe position is out of a threshold range continues for a given period (YES at step S110), for example, information that recommends to perform a probe positioning scan is displayed on a GUI (step S1111). The rescan control unit 133b displays, for example, a recommendation "Acquire data on an area covering the diaphragm" or a recommendation "Execute xx" by specifying an application name on the GUI. The processing at step S1111 may be omitted by automating starting of acquisition of data on an area covering the diaphragm.

When receiving an acceptance from the operator, the rescan control unit 133b controls the sequence controller 120 to perform a probe positioning scan for the second time to acquire data on an area covering the diaphragm (step S1112). Furthermore, on the basis of the data acquired by performing the probe positioning scan for the second time, the correction amount deriving unit 133c derives the probe position (step S1113).

Here, for example, the correction amount deriving unit 133c automatically derives the probe position on the basis of the data that is acquired by performing a probe positioning scan for the second time. For example, the correction amount deriving unit 133c acquires 3D MR data according to the acquisition region that is previously set for the abdomen of the subject and generates volume data from the acquired MR data. The correction amount deriving unit 133c then matches the generated volume data to a prepared model image representing the shape of the diaphragm to specify the position of the apex of the convex surface of the right diaphragm. On the basis of the position of the apex of the convex surface of the right diaphragm, the correction amount deriving unit 133c sets the probe position. For example, the correction amount deriving unit 133c sets the probe position according to the above-described method at step S502 of the second embodiment shown in FIG. 12.

The correction amount deriving unit 133c compares the probe position derived at step S103 and the probe position derived at step S1113 to derive an amount of the shift of the probe position (shift amount of the probe position) and, from the shift amount, derives a correction amount for the imaging position of the slice image of the heart (step S1114). Here, for example, the correction amount deriving unit 133c reads the information representing the probe position that is stored in the storage 132 and compares the position represented by the read information and the probe position derived at step S1113.

For example, the correction amount deriving unit 133c calculates, as a shift amount of the probe position, an amount of the shift of the center of the area of a quadrangular prism where a cuboid 90° pulse application region (ROI1) and a cuboid 180° pulse application region (ROI2) cross each other. The shift amount of the probe position is represented as a difference between the numeric values on the sets of coordinates of a patient coordinate system. Supposing that the direction and amount of the shift of the position of the basic slice image of the heart equal to those of the probe position, the correction amount deriving unit 133c then derives a correction amount for the imaging position of the slice image of the heart.

Thereafter, the sequence controller 120 corrects the position at which a basic slice image of the heart is imaged (imaging position of a basic slice image of the heart) that is determined at step S104 with the correction amount that is derived at step S1114 (step S1115) and the procedure returns to the processing for performing the trace scan at step S106 again. Here, for example, the sequence controller 120 corrects the information representing the imaging position of a basic slice image of the heart stored in the storage 132, using the correction amount derived at step S1114.

According to the description of step S103 of the first embodiment, the image for positioning is displayed on the GUI to accept settings for the ROI and ROI2 from the operator. Alternatively, for example, in the second embodiment, at step S103, a probe position may be automatically derived on the basis of the data acquired by performing a probe positioning scan as in the case of step S1113. Accordingly, the load of the operator to set the probe position can be reduced and the imaging of the heart using motion detection pulses can be performed more easily.

As described above, in the third embodiment, the sequence controller 120 performs, as a preparation scan, an application region scan for acquiring first data on an area covering the diaphragm in order to position the application region of the motion detection pulse and a multi-slice scan for acquiring multi-slice data on an area covering the heart in order to position the slice image of the heart. The sequence controller 120 performs a main scan for acquiring a slice image of the heart, which is positioned using the multi-slice data acquired by performing the preparation scan, with application of motion detection pulses. Furthermore, when the breathing motion of the subject that is detected using motion detection pulses is continuously out of the allowable range for a given period, the sequence controller 120 acquires second data by performing an application region scan again and, using the acquired second data and the positional relationship obtained from the application region scan and the multi-slice scan that are performed in the preparation scan, corrects, by calculation, the imaging position of the slice image of the heart acquired in the main scan.

As described, in the third embodiment, even when the probe position shifts with the move of the subject P and accordingly a trace scan cannot be performed normally, an application region scan is performed for the second time and, by making a comparison with the result of the application region scan for the first time, the imaging position of the slice image of the heart is corrected by internal calculations. As a result, according to the third embodiment, repositioning of the imaging position of the slice image of the heart can be repositioned easily.

Fourth Embodiment

A fourth embodiment will be described here. For the second embodiment, the case has been described where, when the breathing motion of the subject that is detected using motion detection pulses is continuously out of the allowable range for the given period, a multi-slice scan is performed again to correct the application region of the motion detection pulse. On the other hand, for the fourth embodiment, a case will be described where, when the breathing motion of the subject that is detected using motion detection pulses is continuously out of an allowable range for a given period, a maximum FOV scan is performed again to correct the position of the slice image of the heart that is acquired in the main scan.

In the fourth embodiment, a correction amount for the imaging position of the slice image of the heart is derived using the relative positional relationship between the diaphragm and the heart obtained from the data that is acquired by performing a maximum FOV scan during a preparation scan and the position of the application region of the motion detection pulse that is derived from the data acquired by performing a maximum FOV scan again.

FIG. 15 is a flowchart of an imaging procedure according to the fourth embodiment. FIG. 10 representing the second embodiment and FIG. 15 representing the fourth embodiment will be compared to each other and the different aspect between them will be described mainly here.

In the fourth embodiment, as shown in FIG. 15, when a state where the probe position is out of a threshold range continues for a given period in a trace scan during an imaging scan (YES at step S411), for example, information that recommends to perform a maximum FOV scan is displayed on a GUI (step S1412). The rescan control unit 133b displays, for example, a recommendation "Acquire maximum FOV volume data" or a recommendation "Execute xx" by specifying an application name on the GUI. The processing at step S1412 may be omitted by automating the start of acquisition of maximum FOV volume data.

When receiving an acceptance from the operator, the rescan control unit 133b controls the sequence controller 120 to acquire maximum FOV volume data for the second time (step S1413). Furthermore, using the acquired maximum FOV volume data, the rescan control unit 133b derives the position of the diaphragm (step S1414). For example, by matching the maximum FOV volume data to a prepared model image representing the shape of the diaphragm, the correction amount deriving unit 133c specifies the position of the apex of the convex surface of the right diaphragm.

Using the relative positional relationship between the diaphragm and the heart derived at step S404 and the position of the diaphragm derived at step S1414, the correction amount deriving unit 133c directly derives a correction amount for the imaging position of the slice image of the heart (step S1415). Here, for example, the correction amount deriving unit 133c reads information representing the relative positional relationship between the diaphragm and the heart that is stored in the storage 132 and, using the positional relationship represented by the read information and the position of the diaphragm derived at step S1414, calculates a correction amount for the imaging position of the slice image of the heart. In other words, the correction amount deriving unit 133c derives, as the shifted imaging position of a basic slice image of the heart, a position distant from the shifted diaphragm by a given distance and in a given direction.

Thereafter, the sequence controller 120 corrects the imaging position of a basic slice image of the heart that is determined at step S104 using the correction amount derived at step S1415 (step S1416) and the procedure returns to the processing for performing the trace scan at step S106 again.

As described above, according to the fourth embodiment, the relative positional relationship between the probe position and the heart position is acquired from the same data. Accordingly, an error caused by the move of the subject P while the relative positional relationship between them is specified can be removed and the slice image of the heart can be repositioned more accurately.

In the fourth embodiment, the position of the diaphragm is derived on the basis of the maximum FOV volume data that is reacquired and, on the basis of the relative positional relationship between the diaphragm and the heart obtained from the data acquired in the preparation scan, the imaging position of a basic slice image of the heart is corrected. However, embodiments are not limited to this. For example, inversely, the position of the heart may be derived on the basis of the maximum FOV volume data that is reacquired and, on the basis of the relative positional relationship between the diaphragm and the heart obtained from the data acquired in the preparation scan, the position of the application region of the motion detection pulse (probe position) may be corrected.

For the fourth embodiment, the example has been described where a maximum FOV scan is performed as an application region scan that is performed again. However, embodiments are not limited to this. For example, a scan for acquiring data on a local area covering the diaphragm may be performed as the application region scan that is performed again. In other words, the application region scan referred to here is, unlike a maximum FOV scan for acquiring data on a wide area covering the diaphragm and the heart, a scan for acquiring data on a local area covering only the diaphragm and the surrounding of the diaphragm. For example, for the local area covering the diaphragm, an area in a size covering only the diaphragm and the surrounding of the diaphragm is automatically set on the basis of the position of the diaphragm specified from the maximum FOV volume data acquired in the preparation scan at step S404.

As described above, in the MRI apparatus 100 according to each embodiment, in order to position an application region of the motion detection pulse and a slice image of the heart, the sequence controller 120 performs a preparation scan for acquiring a plurality of types of data. The correction amount deriving unit 133c derives the positional relationship between the diaphragm and the heart of a subject from the data that is acquired by performing the preparation scan. The sequence controller 120 performs a main scan for acquiring the slice image of the heart that is positioned using the data acquired by performing the preparation scan, with application of motion detection pulses. When the breathing motion of the subject that is detected using the motion detection pulses is out of an allowable range continuously for a given period, the sequence controller 120 reacquires at least one type of data from among a plurality of types of data acquired by the preparation scan unit and, using the reacquired data and the positional relationship derived by the correction amount deriving unit 133c, corrects, by calculation, at least any one of the position of the application region of the motion detection pulse and the imaging position of the slice image of the heart.

Other Embodiments

Embodiments are not limited to the above-described embodiments.

Method for Applying Motion Detection Pulse

In the above-described embodiments, the two-plane crossing method is described as the method for applying motion detection pulses. However, embodiments are not limited to this. For example, a pencil-beam method that is used in a pulse sequence of a gradient echo (GE) series may be used.

Furthermore, for example, for the above-described embodiments, motion correction using a 1D motion probe has been described as a method of correcting the shift of the position of the imaging region resulting from the breathing motion. However, embodiments are not limited to this. For example, motion correction using a 2D motion probe may be used. Regarding the 2D motion probe, 2D Fourier transform is performed on MR data that is acquired using the motion probe and, on the basis of the imaged data, for example, the amounts of shift of the diaphragm in the vertical direction and anteroposterior direction are detected. In this case, for a cross section using the 2D Motion Probe, a 2D horizontal cross section about the line along the body axis passing through the specified position (point) of the apex of the diaphragm can be set. Alternatively, because the positions of important internal organ or the vascular system can be specified, a cross-section about the line along the body-axis passing through the position (point) of the apex of the diaphragm may be set at an angle such that these important internal organs are avoided.

Application to Different Imaging in the Same Examination

For the above-described embodiments, the case has been described where, imaging of a basic slice image of the heart is assumed as an imaging scan, and, using the multi-slice data that is acquired for the second time, the probe position for the imaging scan is corrected. However, embodiments are not limited to this. For example, when different imaging is performed as an imaging scan during the same examination, it is unnecessary to additionally perform probe positioning for the "different" imaging and a correction can be made using the probe position that is already set.

For example, it is assumed that, as an imaging scan for imaging the heart according to the motion of the diaphragm during the same examination, the coronary artery running over the heart (whole heart (WH) magnetic resonance coronary angiography (MRCA)) is imaged differently from imaging of a basic slice image of the heart. In the same examination, because a patient coordinate system and an apparatus coordinate system are normally common, a correction can be made using the probe position that is already set. In other words, when the WH is imaged, it is unnecessary to additionally position the probe. For example, if at least the data on an area covering the heart and the position of the heart is determined during a preparation scan for positioning the imaging region of the WH, it is possible to set a probe position for WH imaging by only correcting the probe position that is already set in the heart basic slice image imaging that is previously performed on the basis of the amount of shift of the heart and the relative positional relationship between the diaphragm and the heart.

Furthermore, for example, in an examination on the heart, a plurality of types of protocols may be performed in one examination. The examination performed by the MRI apparatus 100 includes a group of pulse sequences, such as various types of preparation scan and imaging scan.

Each of the protocol groups includes one or more protocols such as, for example, a protocol for acquiring a sensitivity map, a protocol for shimming, a protocol for acquiring multi-slice images, and a protocol for imaging. Protocols for imaging are aimed differently, i.e., a protocol for acquiring a basic cardiac slice image of the heart, a protocol for imaging the coronary artery running over the heart, and a protocol for acquiring cine-images. In other words, one "protocol" can be referred to as a unit of pulse sequences that are implemented consecutively as a series of processes without any wait time due to, for example, some operation by the operator.

For example, in a cardiac examination method performed by an MRI apparatus, because a plurality of types of examination are carried out, a plurality of protocols previously determined per examination are sequentially performed. For example, in a cardiac examination method performed by an MRI apparatus, a cine examination, a flow examination, a perfusion examination, an LGE (Late Gadolinium Enhancement) examination, and a coronary artery examination are performed.

The cine examination is an examination for observing the shape and motion of the cardiac muscle and valve, where a protocol for acquiring cine images is performed. The flow examination is an examination for determining whether there is a backward flow of the blood, where a protocol for imaging the speed of the blood flow is performed. The perfusion examination is an examination for determining whether there is ischemia, where a protocol for acquiring perfusion images using a contrast agent is performed. The LGE examination is an examination for determining whether there is myocardial infarction, where a protocol for acquiring a delay contrast image is performed. The coronary artery examination is an examination for determining whether there is a stricture in the coronary artery, where a protocol for imaging the coronary artery running over the heart is performed.

According to, from among these protocols, the protocols for the cine examination, the flow examination, the perfusion examination, and the LGE examination, image data is acquired in a state where the subject is holding the breath. According to these protocols, on the basis of the information on positioning that is performed by using multi-slice images that are acquired previously, image data is acquired. According to the protocol for the coronary artery examination, the data of images over the heart is acquired under free breathing.

As described above, when a plurality of types of protocols are implemented during one examination, the position of the application region of the motion detection pulse or the imaging position of the slice image of the heart may be corrected according to the move of the subject each time when each protocol is performed.

In this case, for example, when performing a plurality of types of protocols in one examination, the sequence controller 120 performs a monitoring scan before starting to perform each protocol and monitors the breathing motion of the subject detected using motion detection pulses. When the breathing motion of the subject is continuously out of an allowable range for a given period, the sequence controller 120 reacquires at least one type of data from among a plurality of types of data acquired during the preparation scan and corrects, by calculation, at least one of the position of the application region of the motion detection pulse and the imaging position of the slice image of the heart.

Specific Values and Order of Processing

In principle, the specific values and order in which processing is performed that are illustrated for the above-described embodiments are examples only. For example, the landmarks used to derive the positions of the probe and the heart may be changed arbitrarily. Furthermore, the order in which processing is performed may be changed arbitrarily.

According to the magnetic resonance imaging apparatus of at least any one of the above-described embodiments, when a subject moves while the subject is imaged, motion detection pulses for detecting the breathing motion or a slice image of the heart can be repositioned easily.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
   MRI system components including a processor and a memory that stores processor-executable instructions that, when executed by the processor, cause the MRI system components to:
   perform a preparation scan including an application region scan and a multi-slice MRI scan, the application region scan acquiring MR data on an area covering a diaphragm in order to position an application region of a motion detection pulse for detecting breathing motion of a subject, the multi-slice MR scan acquiring first multi-slice MR data on an area covering a heart in order to position a slice image of the heart; and
   acquire the slice image of the heart that is positioned using the first multi-slice MR data, with application of the motion detection pulse,
   wherein, in acquiring the slice image, the instructions cause the MRI system components to obtain a position of the diaphragm based on the MR data acquired by the application region scan, and when the position of the diaphragm continues to be out of an allowable range for a given period, the instructions cause the MRI system components to thereafter acquire second multi-slice MR data by performing the multi-slice MRI scan again, and to correct a position of the application region of the motion detection pulse by calculation using the again acquired second multi-slice MR data and a positional relationship that is (a) a relationship between a position of the heart obtained from the second multi-slice MR data and a position of the heart obtained from the first multi-slice MR data acquired by the multi-slice MRI scan included in the preparation scan or (b) a relationship between a position of the diaphragm and a position of the heart which are obtained from the MR data acquired by the application region scan included in the preparation scan.

2. The magnetic resonance imaging apparatus according to claim 1, wherein, in acquiring the slice image, a shift amount of the heart is derived by comparison of a position of the slice image of the heart obtained from the first multi-slice MR data and a position of the slice image of the heart obtained from the second multi-slice MR data, and, from the shift amount, a correction amount is derived for the position of the application region of the motion detection pulse.

3. The magnetic resonance imaging apparatus according to claim 1, wherein
   the application region scan acquires data on an area covering the diaphragm and the heart, and,
   in acquiring the slice image, a correction amount is derived for the position of the application region of the motion detection pulse, using a relative positional relationship between the diaphragm and the heart obtained from the MR data acquired by the application region scan and the position of the slice image of the heart obtained from the second multi-slice MR data.

4. A magnetic resonance imaging apparatus comprising:
   MRI system components including a processor and a memory that stores processor-executable instructions that, when executed by the processor, cause the MRI system components to:
   perform a preparation scan including an application region scan and a multi-slice MRI scan, the application region scan acquiring first MR data on an area covering a diaphragm in order to position an application region of a motion detection pulse for detecting breathing motion of a subject, the multi-slice MRI scan acquiring multi-slice MR data on an area covering a heart in order to position a slice image of the heart; and
   acquire the slice image of the heart that is positioned using the multi-slice MR data, with application of the motion detection pulse,
   wherein, in acquiring the slice image, the instructions cause the MRI system components to obtain a position of the diaphragm based on the MR data acquired by the application region scan, and when the position of the diaphragm continues to be out of an allowable range for a given period, the instructions cause the MRI system components to thereafter acquire second MR data by performing the application region scan again, and to correct an imaging position of the slice image of the heart in a main scan by calculation using the again acquired second MR data and a positional relationship that is (a) a relationship between a position of the diaphragm obtained from the second MR data and a position of the diaphragm obtained from the first MR data acquired by the multi-slice MRI scan included in the preparation scan or (b) a relationship between a position of the diaphragm and a position of the heart which are obtained from the first MR data acquired by the application region scan included in the preparation scan.

5. The magnetic resonance imaging apparatus according to claim 4, wherein, in acquiring the slice image, a shift amount of the motion detection pulse is derived by comparison of a position of the application region of the motion detection pulse obtained from the first MR data and a position of the application region of the motion detection pulse obtained from the second MR data, and, from the shift amount, a correction amount is derived for the imaging position of the slice image of the heart.

6. The magnetic resonance imaging apparatus according to claim 4, wherein the application region scan acquires the first MR data on an area covering the diaphragm and the heart, and,
in acquiring the slice image, a correction amount for the imaging position of the slice image of the heart is derived using a relative positional relationship between the diaphragm and the heart obtained from the first MR data and the position of the application region of the motion detection pulse obtained from the second MR data.

7. The magnetic resonance imaging apparatus according to claim 4, wherein, the application region scan is performed on an area covering the diaphragm and the heart, and,
in acquiring the slice image, the application region scan is performed on a local area covering the diaphragm, and a correction amount is derived for the imaging position of the slice image of the heart, using a relative positional relationship between the diaphragm and the heart obtained from the first MR data and the position of the application region of the motion detection pulse obtained from the second MR data.

* * * * *